US011982011B2

(12) United States Patent
Thete et al.

(10) Patent No.: US 11,982,011 B2
(45) Date of Patent: May 14, 2024

(54) PLASMA ELECTROLYTIC POLISHED DIESEL ENGINE COMPONENTS

(71) Applicant: Cummins Inc., Columbus, IN (US)

(72) Inventors: Manoj M. Thete, Greenwood, IN (US); Romaine O. Edwards, Greenwood, IN (US)

(73) Assignee: Cummins Inc., Columbus, IN (US)

( * ) Notice: Subject to any disclaimer, the term of this patent is extended or adjusted under 35 U.S.C. 154(b) by 475 days.

(21) Appl. No.: 17/053,967

(22) PCT Filed: Nov. 30, 2018

(86) PCT No.: PCT/US2018/063337
§ 371 (c)(1),
(2) Date: Nov. 9, 2020

(87) PCT Pub. No.: WO2019/226196
PCT Pub. Date: Nov. 28, 2019

(65) Prior Publication Data
US 2021/0269935 A1 Sep. 2, 2021

Related U.S. Application Data

(60) Provisional application No. 62/674,862, filed on May 22, 2018.

(51) Int. Cl.
*C25F 3/16* (2006.01)
*C23C 14/02* (2006.01)
(Continued)

(52) U.S. Cl.
CPC .............. *C25F 3/16* (2013.01); *C23C 14/028* (2013.01); *C23C 16/0254* (2013.01);
(Continued)

(58) Field of Classification Search
CPC . C25F 3/16; C25F 7/00; C23C 14/028; C23C 16/0254; C23C 16/50; F02M 65/007
See application file for complete search history.

(56) References Cited

U.S. PATENT DOCUMENTS 9,190,239 B2 11/2015 Chang et al.
9,764,403 B2 9/2017 Bayer et al.
(Continued)

FOREIGN PATENT DOCUMENTS

CN 101210318 A 7/2008
CN 101629295 A 1/2010
(Continued)

OTHER PUBLICATIONS

Cornelsen, Matthias, "Electrolytic Plasma Polishing of Pipe Inner Surfaces," Metals, Book 8, vol. 1, 2008; 12 pages.
(Continued)

*Primary Examiner* — Kelly M Gambetta
(74) *Attorney, Agent, or Firm* — Taft, Stettinius & Hollister LLP (57) ABSTRACT

A method and system is provided for reducing surface roughness of a diesel engine component. The method and system may apply a voltage to a plasma electrolyte polishing cell. The plasma electrolyte polishing cell may include a diesel engine component and an aqueous electrolyte solution. The method and system may cause a plasma layer to form around a surface of the diesel engine component as a result of applying the voltage to the plasma electrolyte polishing cell. The method and system may terminate the voltage to the plasma electrolyte polishing cell. The method and system may apply a coating process to the diesel engine component.

22 Claims, 9 Drawing Sheets (51) Int. Cl.
    *C23C 16/02*     (2006.01)
    *C23C 16/50*     (2006.01)
    *C25F 7/00*     (2006.01)
    *F01L 3/22*     (2006.01)
    *F02M 65/00*     (2006.01)

(52) U.S. Cl.
    CPC ............... *C23C 16/50* (2013.01); *C25F 7/00* (2013.01); *F01L 3/22* (2013.01); *F02M 65/007* (2013.01)

(56) References Cited

U.S. PATENT DOCUMENTS

| | | | |
|---|---|---|---|
| 2007/0256938 | A1 | 11/2007 | Fruth |
| 2007/0264491 | A1* | 11/2007 | Asano ................... C23C 28/343 428/408 |
| 2010/0200424 | A1 | 8/2010 | Mayorov et al. |
| 2020/0123675 | A1* | 4/2020 | Housden ................... C25F 3/24 |

FOREIGN PATENT DOCUMENTS

| | | | |
|---|---|---|---|
| CN | 101629521 | A | 1/2010 |
| CN | 102265023 | A | 11/2011 |
| CN | 103600146 | A | 2/2014 |
| DE | 3712205 | A1 | 10/1988 |
| JP | S6044227 | A | 3/1985 |
| JP | 2009074417 | A | 4/2009 |
| RU | 2260079 | C2 | 9/2005 |
| WO | 136138 | A1 | 5/2001 |
| WO | 2015192818 | A1 | 12/2015 |
| WO | 2017060701 | A1 | 4/2017 |
| WO | 2017157833 | A1 | 9/2017 |

OTHER PUBLICATIONS

Chinese Office Action for Chinese Patent Application No. 201880093275.0, dated Apr. 6, 2022.
First Examination Report from the Indian Patent Office for Indian Patent Application No. 202017046072, dated Jun. 30, 202.
International Preliminary Report on Patentability received for PCT Patent Application No. PCT/US2018/063337, dated Dec. 3, 2020, 07 pages.
International Search Report and Written Opinion received for PCT Patent Application No. PCT/US2018/063337, dated Feb. 2, 2019, 02 pages.
Chinese Examination Report, Chinese Appln. No. 20188093275.0, 16 pgs., dated May 22, 2023.

* cited by examiner

| Rz, SAMPLE 1, PROCESS TIME: 2.5 MIN | | |
|---|---|---|
| | BEFORE (μM) | AFTER (μM) |
| 310 | 0.965 | 0.556 |
| 320 | 0.743 (Ra = 0.139) | 0.079 (Ra = 0.016) |
| 330 | 0.675 | 0.112 |
| 340 | 0.836 | 0.478 |
| 350 | 0.835 | 0.468 |
| 360 | 0.796 | 0.452 |

PLASMA ELECTROLYTIC POLISHED
DIESEL ENGINE COMPONENTS

CROSS-REFERENCE TO RELATED
APPLICATIONS

This application is a national phase filing of International Application No. PCT/US2018/063337, filed Nov. 30, 2018, which claims reference to U.S. Provisional Application No. 62/674,862, filed May 22, 2018, the disclosures of which being expressly incorporated herein by reference.

FIELD OF THE DISCLOSURE

The present disclosure generally relates to diesel engine components, and more specifically to polishing diesel engine components using a plasma electrolytic polished process.

BACKGROUND OF THE DISCLOSURE

Some engine components, and in particular diesel engine components, might not initially possess surface properties and/or characteristics that are required to perform certain functions. For example, fuel injection system components of the diesel engine may include components with complex geometries, match-fit components, coated components, and/or components subjected to fatigue, wear, and friction. Therefore, the components may require characteristics and properties that are not inherent even after careful manufacturing. For instance, the surface finish (e.g., roughness) of some of the components may initially be unacceptable for performing some necessary functions during operation of the diesel engine.

In some instances, the components may be processed to reduce the surface roughness. For example, the process to reduce the surface roughness may include a variety of precision machining techniques, such as grinding, super finishing, tape polishing, and/or other processes such as electro-chemical machining. However, some of these techniques, such as electro-chemical machining and electropolishing, may require electrode or electrodes shaped in the form that needs to be machined in to the workpiece and may use chemicals that create hazardous waste. Additionally, due to the complex geometries of the components (e.g., curved or conical surfaces), some techniques might not be effective to reduce the surface roughness to an adequate amount. Accordingly, it is desirable to use a system and method that eliminates or alleviates one or more operational disadvantages described above.

SUMMARY OF THE DISCLOSURE

In some embodiments, a method and system is provided for reducing surface roughness of a diesel engine component. The method and system may apply a voltage to a plasma electrolyte polishing cell. The plasma electrolyte polishing cell may include a diesel engine component and an aqueous electrolyte solution. The method and system may cause a plasma layer to form around a surface of the diesel engine component as a result of applying the voltage to the plasma electrolyte polishing cell. The method and system may terminate the voltage to the plasma electrolyte polishing cell. The method and system may apply a coating process to the diesel engine component after causing the plasma layer to form around the surface of the diesel engine component.

In some examples, the diesel engine component is a high pressure fuel injector component. In some instances, the diesel engine component is a valve seat. In some variations, the diesel engine component is an injector nozzle. In some examples, by applying the voltage to the plasma electrolyte polishing cell, the method and system causes the injector nozzle to be cleaned. In some instances, the method and system applies the voltage for a predetermined period of time. In some variations, the method and system receives, from a user interface, user input indicating a period of time to apply the voltage to the plasma electrolyte polishing cell. Further, the method and system applies the voltage for the period of time indicated by the user input. In some examples, the method and system (e.g., a physical vapor deposition (PVD) coating system or a plasma enhanced chemical vapor deposition (PECVD) coating system) applies a coating process to the diesel engine component to cause the surface of the diesel engine component to achieve a PVD coating finish or PECVD coating finish.

While multiple embodiments are disclosed, still other embodiments of the present disclosure will become apparent to those skilled in the art from the following detailed description, which shows and describes illustrative embodiments of the present disclosure. Accordingly, the drawings and detailed description are to be regarded as illustrative in nature and not restrictive.

BRIEF DESCRIPTION OF THE DRAWINGS

The above-mentioned and other features of this disclosure and the manner of obtaining them will become more apparent and the disclosure itself will be better understood by reference to the following description of embodiments of the present disclosure taken in conjunction with the accompanying drawings, wherein.

While the present disclosure is amenable to various modifications and alternative forms, specific embodiments have been shown by way of example in the drawings and are described in detail below. The intention, however, is not to limit the present disclosure to the particular embodiments described. On the contrary, the present disclosure is intended to cover all modifications, equivalents, and alternatives falling within the scope of the present disclosure as defined by the appended claims.

DETAILED DESCRIPTION OF THE DISCLOSURE

In the following detailed description, reference is made to the accompanying drawings which form a part hereof, and in which is shown by way of illustration specific embodiments in which the present disclosure is practiced. These embodiments are described in sufficient detail to enable those skilled in the art to practice the present disclosure, and it is to be understood that other embodiments can be utilized and that structural changes can be made without departing from the scope of the present disclosure. Therefore, the following detailed description is not to be taken in a limiting sense, and the scope of the present disclosure is defined by the appended claims and their equivalents.

Figure 1:
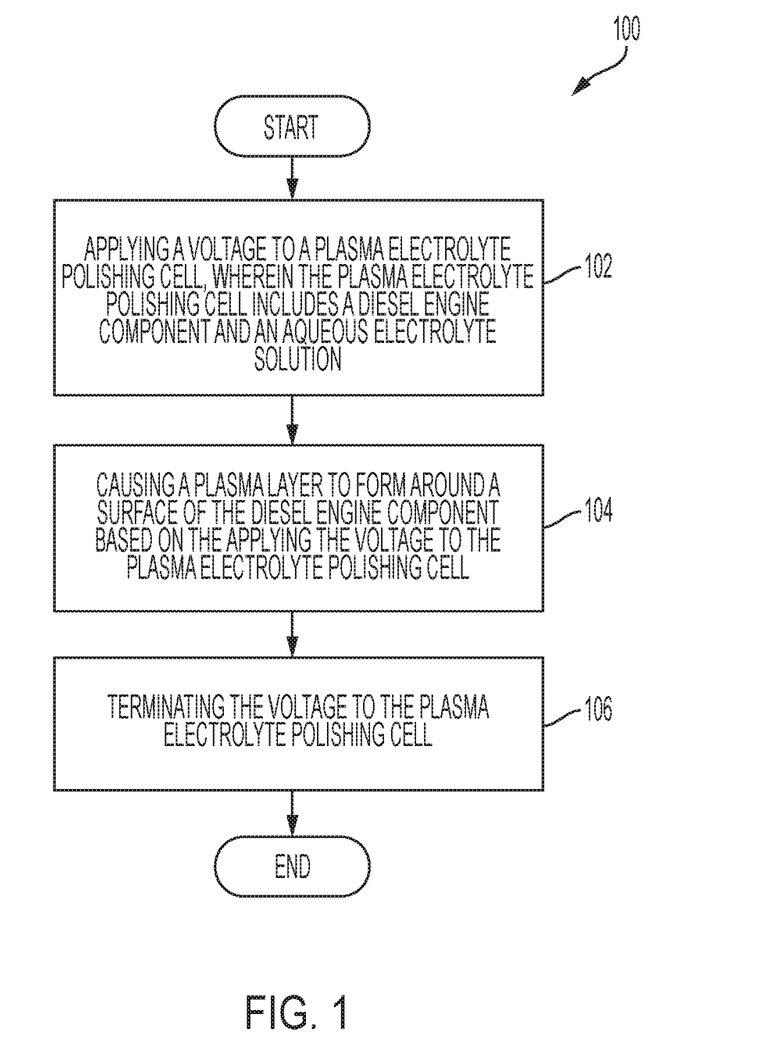
FIG. 1 shows a flowchart illustrating a method for plasma electrolyte polishing of diesel engine components in accordance with embodiments of the present disclosure.

FIG. 1 shows a flowchart illustrating a method 100 for plasma electrolyte polishing (PEP) of metallic diesel engine components. The PEP method 100 (e.g., the PEP process) may be used to improve characteristics and/or properties for metallic diesel engine components. As mentioned previously, certain characteristics and/or properties, such as surface roughness, may be important for the operation of a diesel engine. For instance, surface roughness may be an important factor for optimizing a variety of functional requirements including, but not limited to, friction reduction, fatigue resistance, wear resistance, surface stress optimization, surface preparation for tribological coatings, and wettability. By polishing the surfaces of the metallic diesel engine components, such as high pressure fuel injection system components, the PEP method 100 may allow for improvement of the surface finish of the components.

Figure 2:
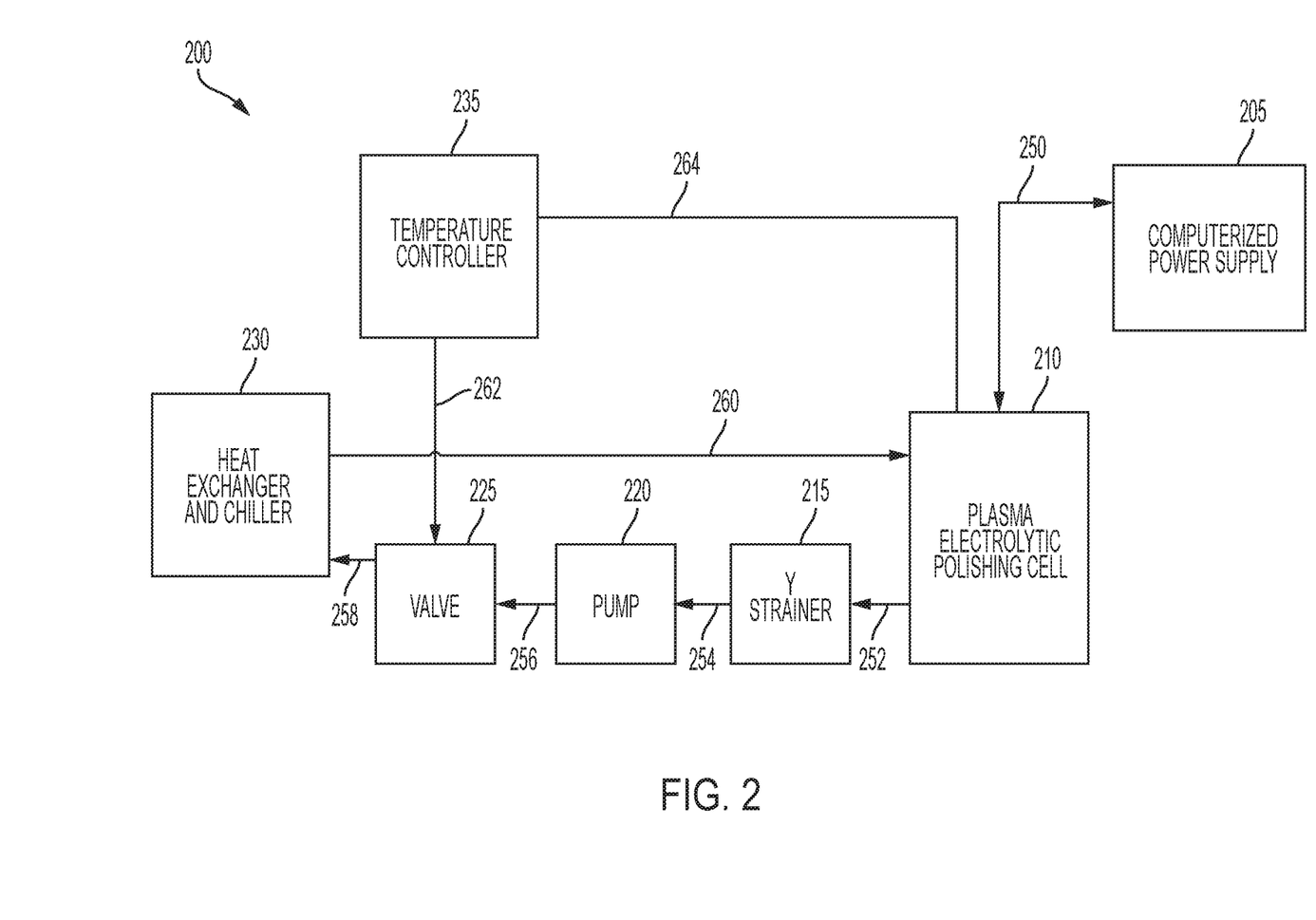
FIG. 2 shows an exemplary plasma electrolyte polishing (PEP) system for polishing diesel engine components in accordance with embodiments of the present disclosure.

FIG. 1 will be described with reference to FIG. 2, which shows an exemplary PEP system 200. FIG. 2 shows an exemplary PEP system 200, and other PEP systems may also be used for plasma electrolyte polishing of metallic diesel engine components. Further, while relatively new, PEP systems are known in the art. However, PEP systems have not been used to polish metallic diesel engine components, such as high pressure fuel injection system components. For instance, the scalability to perform the PEP process for diesel engine components required significant changes to the PEP system (e.g., the PEP system 200), including, but not limited to, the electrolyte conductivity, pH and purity of the electrolyte, the electrolyte replenish rate, the temperature of the electrolyte, and/or the process of changing the plasma electrolytic polishing process cell from a welded metallic (e.g., steel) tank to a plastic tank.

Referring to FIG. 2, the exemplary PEP system 200 includes a computerized power supply 205, a plasma electrolytic polishing (PEP) cell 210, a Y strainer 215, a pump 220, a valve 225, a heat exchanger and chiller 230, and/or a temperature controller 235. Any number of additional units, different units, and/or combinations of units is also included in the PEP system 200. In some implementations, the process 100 and the system 200 described above may be used to improve the surface finish (e.g., PEP), cleaning (e.g., plasma electrolytic cleaning [PEC]), and/or surface preparation of diesel engine components.

Referring to FIG. 1, in operation, at step 102, the PEP system 200 may apply a voltage to a plasma electrolyte polishing cell. For example, referring to FIG. 2, the computerized power supply 205 may apply a voltage to the plasma electrolytic polishing (PEP) cell 210. The PEP cell 210 may include an aqueous plasma electrolyte solution and a diesel engine component. The diesel engine component may be submersed within the aqueous electrolyte solution. In some examples, a fume hood may be included above the PEP cell 210. The fume hood may capture fumes and vapors being created during the process.

Figure 3:
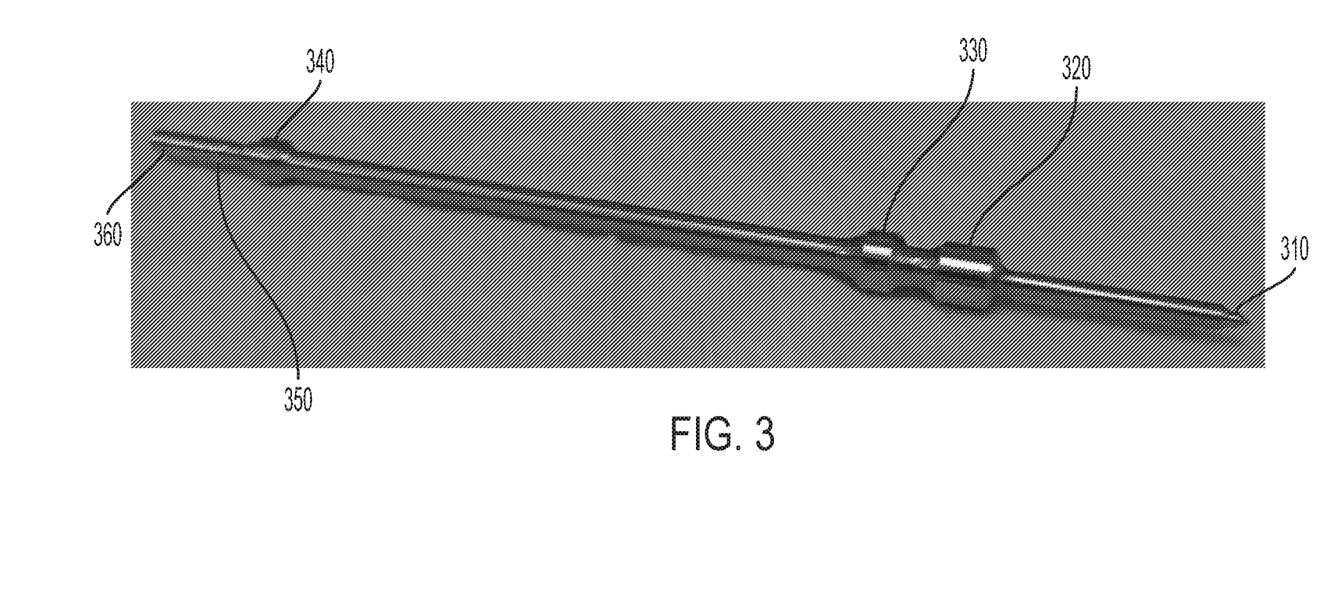
FIG. 3 shows an example of a diesel engine component prior to applying the PEP process in accordance with embodiments of the present disclosure.

FIG. 3 shows an image of a diesel engine component 300 prior to applying the PEP process. The diesel engine component 300 may be submersed within the aqueous plasma electrolyte solution of the PEP cell 210. After submersing the diesel engine component 300 into the solution of the PEP cell 210, the PEP system 200 may apply a voltage to the PEP cell 210 that includes the aqueous plasma electrolyte solution. The diesel engine component 300 may be any metallic diesel engine component, including but not limited to a high pressure fuel injector component such as an injector lower plunger (needle), a valve seat, or an injector nozzle.

The computerized power supply 205 may be any power supply that supplies power to the system 200. For example, the computerized power supply 205 may be a power source (e.g., a battery) that includes a cathode and an anode. The cathode and anode may be connected via conductor(s) 250 to the PEP cell 210. For example, the cathode may be connected to an electrode within the PEP cell 210 and the anode may be connected to the diesel engine component 300. Additionally, and/or alternatively, the cathode may be connected to an edge or the side of the PEP cell 210 and the anode may be connected to the diesel engine component 300.

In some instances, the computerized power supply 205 may include a controller that may communicate with one or more units within system 200. The controller may generate and transmit control signals to the units within system 200, such as to the temperature controller 235. Further, the controller may include one or more processors and computer readable instructions. The one or more processors, when executing the computer readable instructions, may cause the computerized power supply 205 to apply voltage for a pre-determined or preprogrammed period of time, such as for two and a half minutes, five minutes, or ten minutes. Additionally, and/or alternatively, the computerized power supply 205 may include a user interface. The user interface may allow (e.g., receive inputs and/or transmit signals) a user to program and/or change the pre-determined period of time that the computerized power supply 205 applies voltage to the PEP cell 210. The user interface may allow the user to turn on or off the computerized power supply 205 manually or automatically (e.g., after a pre-determined period of time).

At step 104, the PEP system 200 may cause a plasma layer to form around a surface of the diesel engine component 300 as a result of applying the voltage to the PEP cell 210. For example, during the PEP process and by applying voltage to the PEP cell 210, a plasma layer may form around surfaces of the diesel engine component. The characteristics and/or properties for the diesel engine component 300 may change due to the plasma layer being formed around the surface of the component 300. For example, the surface roughness, such as a ten-point mean roughness (Rz) or an arithmetical mean roughness (Ra) of the component 300 may decrease due to the plasma layer.

Additionally, and/or alternatively, the PEP system 200 may monitor the concentration of the electrolytes within the aqueous electrolytic solution and/or the temperature of the aqueous electrolytic solution. For example, the PEP cell 210, a Y strainer 215, a pump 220, a valve 225, and a heat exchanger and chiller 230 may be connected as shown in FIG. 2. The temperature controller 235 and/or the computerized power supply 205 may control the transfer of the aqueous electrolyte solution from the PEP cell 210 through the PEP system 200 (e.g., the Y strainer 215, the pump 220, the valve 225, and/or the heat exchange and chiller 230). By controlling the transfer of the solution, the PEP system 200 may monitor the concentration of the electrolytes and/or the temperature of the aqueous electrolytic solution in order to form properties suitable to form desired layer of plasma.

In operation, the Y strainer 215 may strain out solids and/or electrolytes from the aqueous electrolyte solution of the PEP cell 210. The pump 220 may be controlled by the temperature controller 235 and/or the computerized power supply 205. The pump 220 may pump the aqueous electrolyte solution throughout the PEP system 200.

The valve 225 may be connected between the pump 220 and the heat exchanger and chiller 230. The valve 225 may receive a control signal from the temperature controller 235. For example, the temperature controller 235 may monitor a temperature of the PEP cell 210 (e.g., the solution within the PEP cell 210). The temperature of the PEP cell 210 may be between 20-90 degrees Celsius. In some instances, the temperature may be pre-determined and/or preprogrammed. Additionally, and/or alternatively, the temperature controller 235 and/or computerized power supply 205 may include a user interface and user input may be received for the temperature.

In response to the temperature being greater than or less than a threshold temperature, the temperature controller 235 may send a control signal to the valve 225. The valve 225 may be opened in response to the control signal. Additionally, and/or alternatively, the control signal may be sent to the pump 220, and in response to the control signal, the pump 220 may be turned on to pump solution from the PEP cell 210 through the heat exchanger and chiller 230. The heat exchanger and chiller 230 may be a typical heat exchanger and/or chiller and may heat or cool the aqueous electrolyte solution. Thus, the temperature controller 235 may control and/or maintain the temperature using the heat exchanger and chiller 230.

At step 106, the PEP system 200 may terminate the voltage to the PEP cell 210. For example, the computerized power supply 205 may terminate the voltage to the PEP cell 210. As mentioned previously, the computerized power supply 205 may terminate the voltage after a certain (e.g., pre-determined) period of time and/or manually by the user.

Figure 4:
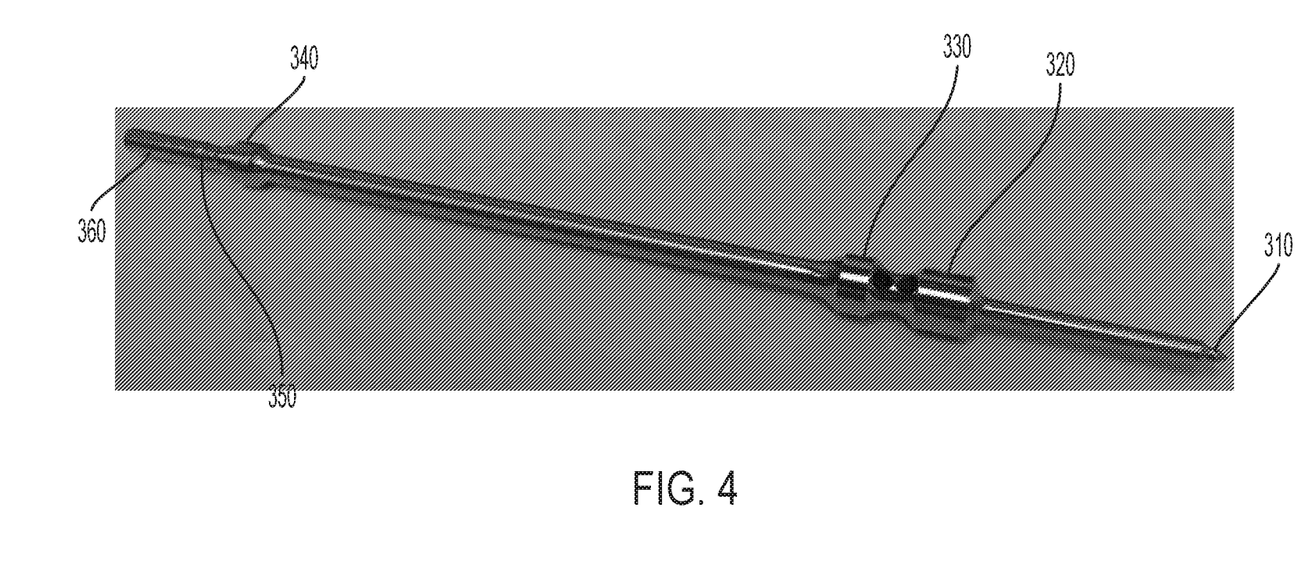
FIG. 4 shows an example of a diesel engine component after applying the PEP process in accordance with embodiments of the present disclosure.
Figure 5:
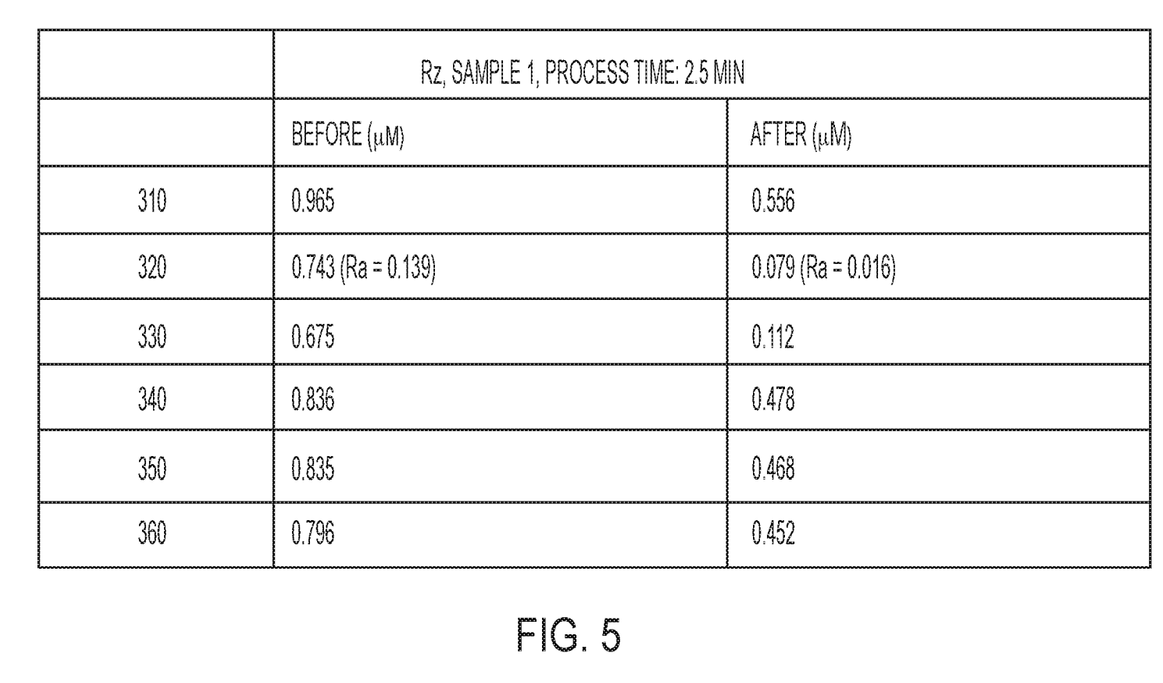
FIG. 5 shows test results of the surface roughness before and after the PEP process in accordance with embodiments of the present disclosure.

FIG. 4 shows an image of a the diesel engine component 300 (e.g., the injector lower plunger) after the PEP process 100, and FIG. 5 shows test results of the surface roughness before and after the PEP process 100. Referring to FIG. 5, the surface roughness (Rz) is shown for the injector lower plunger 300 before and after the PEP process 100. Further, as shown in FIGS. 3 and 4, different sections (e.g., 310, 320, 330, 340, 350, and 360) of the diesel engine component 300 may have different before and after surface roughness. In operation, each of the sections may be required to have a surface roughness (Rz) of less than 1 μm. As shown in FIG. 5, after applying the voltage for 2.5 minutes, the surface roughness of the different sections drastically decreased.

Figure 6:
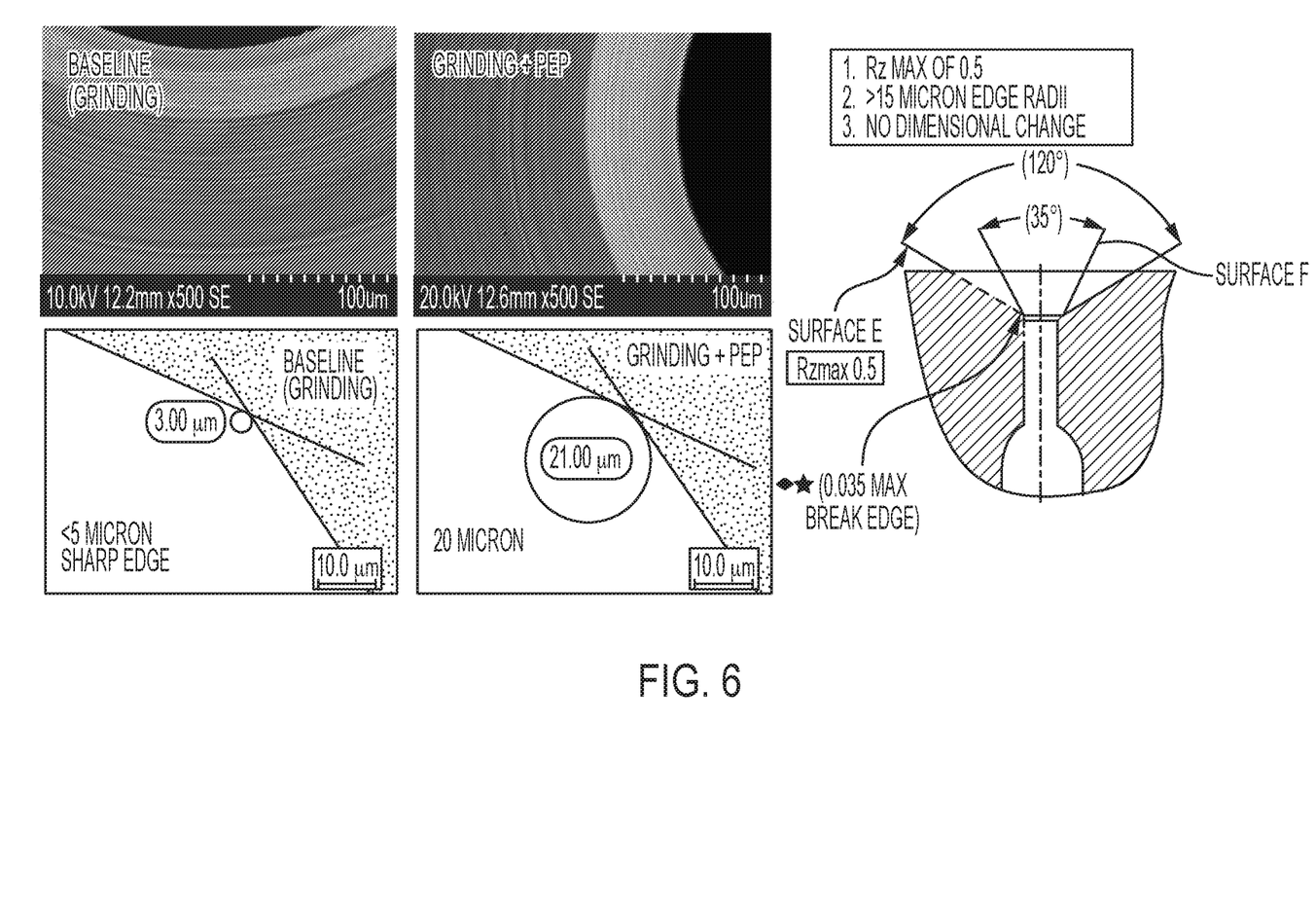
FIG. 6 shows images of a baseline method versus the PEP process for diesel engine components in accordance with embodiments of the present disclosure.

FIG. 6 shows images differences between applying a baseline process versus applying the PEP process for diesel engine components. For example, a baseline method (e.g., grinding) is applied to a high pressure fuel injector component. The baseline method is a current manufacturing process for these components, such as a multiple stage grinding process. For example, the multi-stage grinding process may include first grinding the 120 degree surface, second grinding a 55 degree surface at the bottom of the 120 degree surface, and then deburr the edge between the two angles. Further, the PEP process or method described in FIG. 1 and the system 200 is applied to the same high pressure fuel injector component.

Figure 7:
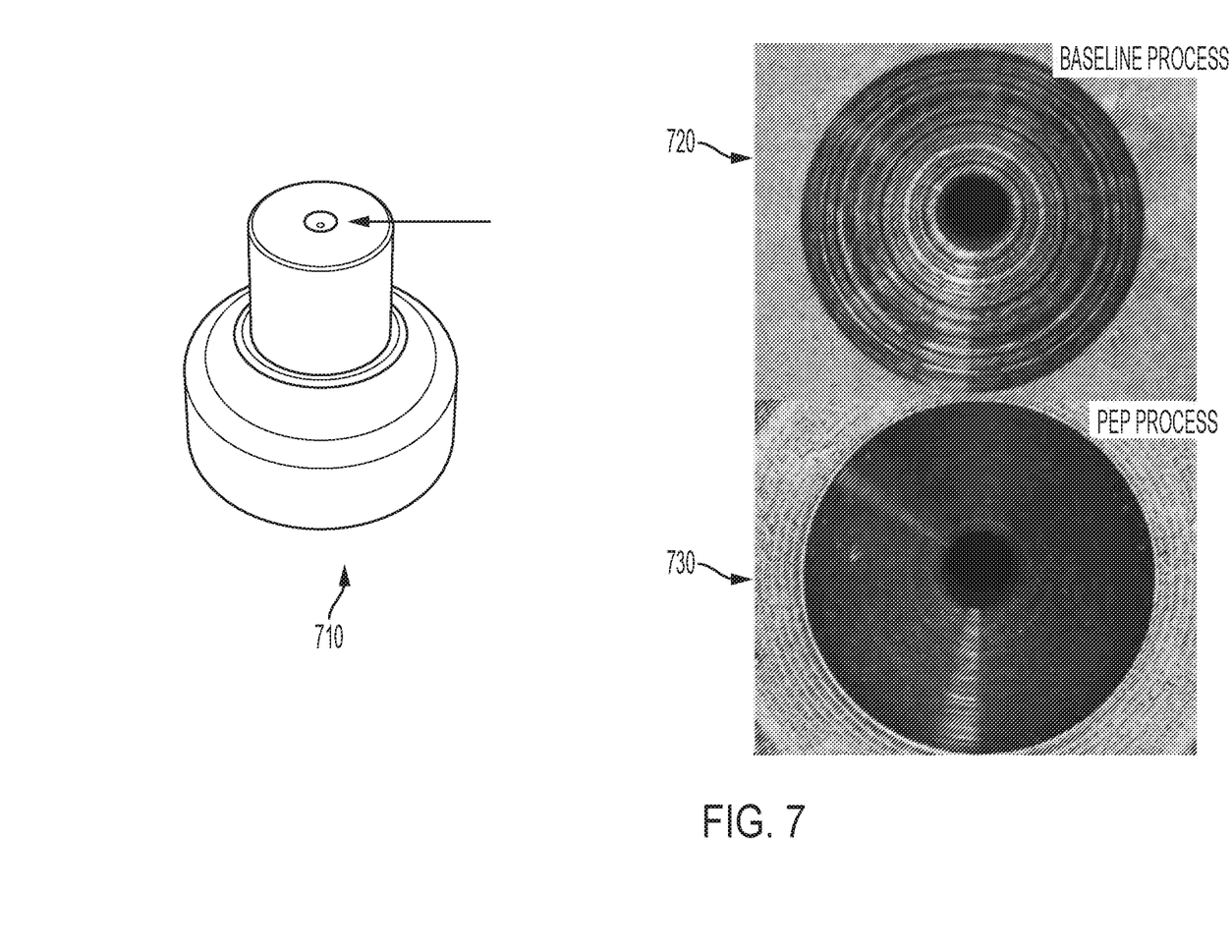
FIG. 7 shows an example of application of the PEP process to a valve seat in accordance with embodiments of the present disclosure.
Figure 8:
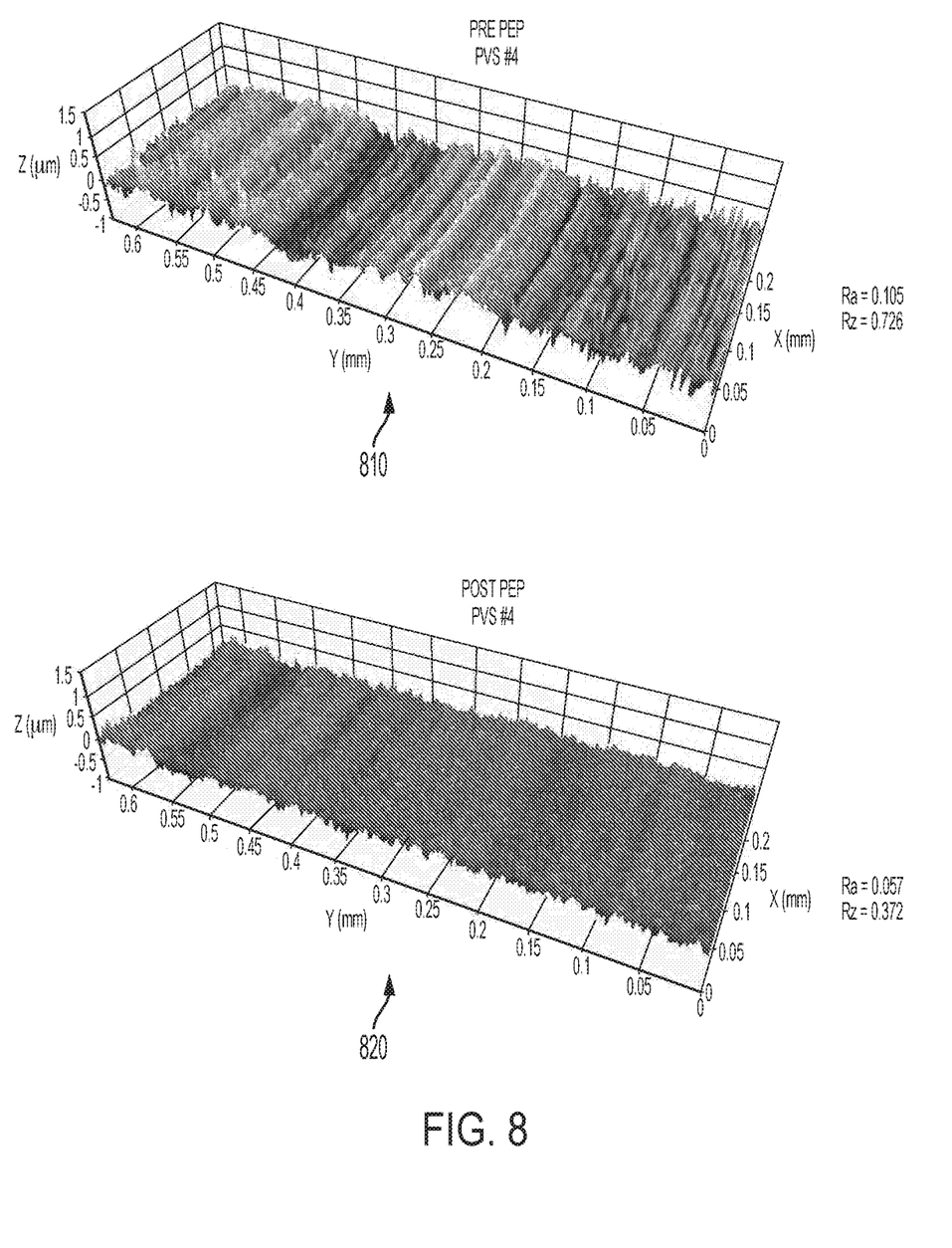
FIG. 8 shows results of the PEP process to the valve seat in accordance with embodiments of the present disclosure.

FIG. 7 shows images of another diesel engine component, in this case a valve seat, before and after applying the PEP process 100. Image 710 shows a valve seat of the diesel engine. Image 720 shows the valve seat after applying a baseline process. Image 730 shows the valve seat after applying the PEP process 100 described in FIG. 1. FIG. 8 shows results of the PEP process to the valve seat. For example, prior to applying the PEP process (e.g., the valve seat shown in image 720), the valve seat may have an Ra of 0.105 micrometers (μm) and an Rz of 0.726 μm. After applying the PEP process (e.g., the valve seat shown in image 730), the valve seat may have an Ra of 0.057 μm and an Rz of 0.372 μm. Thus, the PEP process drastically reduces the Ra and Rz of the valve seat.

Figure 9:
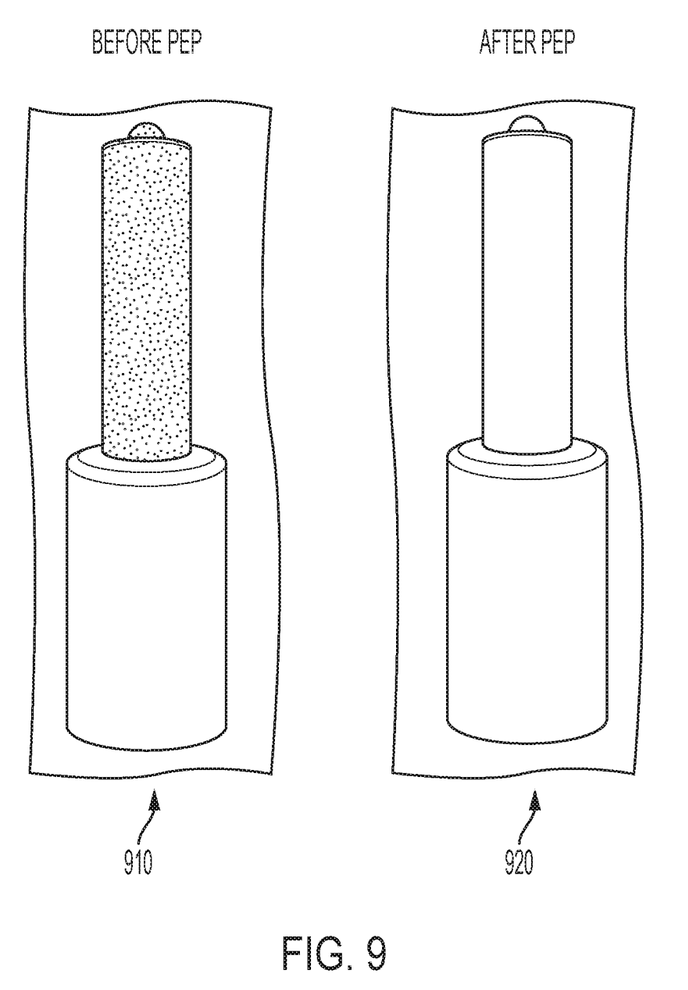
FIG. 9 shows results of use of the PEP process for cleaning diesel engine components (injector nozzle) in accordance with embodiments of the present disclosure.

FIG. 9 shows images of another use or implementation of the PEP process 100. For example, rather than polishing a diesel engine component, the PEP system 200 and the PEP method 100 may be used for plasma electrolytic cleaning (PEC). The purpose of the PEC is to clean debris contaminates and coking deposits for a diesel engine component, such as injector nozzles that may otherwise be scrapped. The PEC process may eliminate acidic chemicals and produce substantially defect free surfaces for the diesel engine component (e.g., injector nozzle). Image 910 shows the injector nozzle before the PEC process. The injector nozzle is dirty and may require cleaning (e.g., the injector nozzle may have been used in operation of the diesel engine). Image 920 shows the injector nozzle after applying the PEC process described in FIG. 1. The injector nozzle of image 920 is clean after using the PEC process and may be used again in operation of the diesel engine.

In some examples, the PEP system 200 and/or the method 100 may be an intermediate system and/or step used for achieving superior coating adhesion. For example, one or more additional systems and/or additional steps, such as an additional coating process or system may be used on the diesel engine component 300 (e.g., a high pressure fuel injector component such as an injector lower plunger (needle) or a valve seat) after completion of method 100. In other words, after completion of method 100 and/or after causing the plasma layer to form around the surface of the diesel engine component 300, the diesel engine component 300 may be put through a coating system, such as a physical vapor deposition (PVD) coating system or a plasma enhanced chemical vapor deposition (PECVP) coating system (e.g., a diamond like carbon (DLC) coating system). By using the coating system to apply a coating process to the diesel engine component 300, the diesel engine component 300 is to able achieve a physical vapor deposition coating finish or a plasma enhanced chemical vapor deposition (PECVP) coating finish, such as a diamond like carbon (DLC) coating finish, on the surface of the diesel engine components 300.

The PVD coating system, the PECVP coating system, and/or the DLC coating system may be traditional coating systems that are known in the art. However, the process of applying the coating system to a diesel engine component 300 after completion of the PEP method 100 and/or use of the PEP system 200 is not known. For example, by using the PEP system 200 and/or the method 100, the surface of the diesel engine components 300 may have a smoother surface finish. Then, when applying the coating system or method, the smoother surface finish permits the coating to adhere better to the surface of the diesel engine component 300, which causes a superior coating finish (e.g., a superior PVD, PECVP, and/or DLC coating finish).

Embodiments of the present disclosure are described by way of example only, with reference to the accompanying drawings. Further, the following description is merely illustrative in nature and is in no way intended to limit the disclosure, its application, or uses. Thus, while this disclosure includes particular examples and arrangements of the units, the scope of the present system should not be so limited since other modifications will become apparent to the skilled practitioner.

Furthermore, no element, component, or method step in the present disclosure is intended to be dedicated to the public regardless of whether the element, component, or method step is explicitly recited in the claims. No claim element herein is to be construed under the provisions of 35 U.S.C. § 112(f), unless the element is expressly recited using the phrase "means for." As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

It is to be understood that the above description is intended to be illustrative, and not restrictive. Many other embodiments will be apparent to those of skill in the art upon reading and understanding the above description. For example, it is contemplated that features described in association with one embodiment are optionally employed in addition or as an alternative to features described in associate with another embodiment. The scope of the present disclosure should, therefore, be determined with reference to the appended claims, along with the full scope of equivalents to which such claims are entitled.

What is claimed is:

1. A method for reducing surface roughness of a diesel engine component, comprising:
    applying a voltage to a plasma electrolyte polishing cell provided in a plasma electrolyte polishing system, wherein the plasma electrolyte polishing cell includes the diesel engine component and an aqueous electrolytic solution;
    monitoring a concentration of electrolytes within the aqueous electrolytic solution and a temperature of the aqueous electrolytic solution to transfer the aqueous electrolyte solution from the plasma electrolyte polishing cell through the plasma electrolyte polishing system;
    controlling transfer of the aqueous electrolytic solution from the plasma electrolyte polishing cell through the plasma electrolyte polishing system in response to the concentration of electrolytes within the aqueous electrolytic solution and the temperature of the aqueous electrolytic solution;
    causing a plasma layer to form around a surface of the diesel engine component as a result of applying the voltage to the plasma electrolyte polishing cell;
    terminating the voltage to the plasma electrolyte polishing cell; and
    after causing the plasma layer to form around the surface of the diesel engine component, applying a coating process to the diesel engine component.

2. The method of claim 1, wherein the diesel engine component is at least one of a high-pressure fuel injector component, a valve seat, and an injector nozzle.

3. The method of claim 2, wherein the diesel engine component is the injector nozzle, and wherein the applying the voltage to the plasma electrolyte polishing cell causes the injector nozzle to be cleaned.

4. The method of claim 1, wherein the applying the voltage to the plasma electrolyte polishing cell comprises applying the voltage for a predetermined period of time.

5. The method of claim 1, further comprising:
    receiving, from a user interface, user input indicating a period of time to apply the voltage to the plasma electrolyte polishing cell, and
    wherein the applying the voltage to the plasma electrolyte polishing cell comprises applying the voltage for the period of time indicated by the user input.

6. The method of claim 1, wherein the applying the coating process to the diesel engine component causes the surface of the diesel engine component to achieve a physical vapor deposition (PVD) coating finish.

7. The method of claim 1, wherein the applying the coating process to the diesel engine component causes the surface of the diesel engine component to achieve a plasma enhanced chemical vapor deposition (PECVD) coating finish.

8. The method of claim 1, wherein, as a result of the method, the diesel engine component has a surface roughness that is less than or equal to one, and wherein the surface roughness includes at least one of a ten-point mean roughness (Rz) and an arithmetical mean roughness (Ra).

9. The method of claim 1, wherein aqueous electrolyte solution is devoid of acidic chemicals and facilitates producing one or more substantially defect-free surfaces for the diesel engine component.

10. The method of claim 1, further comprising at least one of:
    monitoring a concentration of electrolytes within the aqueous electrolytic solution to form properties suitable to form a desired layer of plasma and
    monitoring a temperature of the aqueous electrolytic solution to form properties suitable to form a desired layer of plasma.

11. The method of claim 10, wherein the monitoring the temperature of the aqueous electrolytic solution to form properties suitable to form desired layer of plasma includes ensuring that the aqueous electrolytic solution does not violate a temperature threshold.

12. The method of claim 11, wherein the temperature threshold includes at least one of not to fall below 20 degrees Celsius and not to exceed 90 degrees Celsius.

13. The method of claim 11, further comprising at least one of:
    adjusting the temperature of the aqueous electrolytic solution in response to the temperature threshold being violated, and
    adjusting the concentration of the electrolytes within the aqueous electrolytic solution.

14. The method of claim 1, wherein the controlling transfer of the aqueous electrolyte solution from the plasma electrolyte polishing cell through the plasma electrolyte polishing system includes at least one of a strainer and a heat exchanger.

15. The method of claim 1, wherein terminating the voltage to the plasma electrolyte polishing cell after a predetermined time is in response to a desired surface of the diesel engine component.

16. A system for reducing surface roughness of a diesel engine component, comprising:
- a plasma electrolyte polishing system comprising:
- a plasma electrolyte polishing cell;
- the diesel engine component, wherein the diesel engine component is submersed within the plasma electrolyte polishing cell, and wherein the plasma electrolyte polishing cell comprises an aqueous electrolytic solution;
- a controller operatively coupled to the plasma electrolyte polishing cell, wherein the controller is configured to:
- monitor a concentration of electrolytes within the aqueous electrolytic solution and a temperature of the aqueous electrolytic solution to transfer the aqueous electrolytic solution from the plasma electrolyte polishing cell through the plasma electrolyte polishing system;
- control transfer of the aqueous electrolytic solution from the plasma electrolyte polishing cell through the plasma electrolyte polishing system in response to a concentration of electrolytes of the aqueous electrolytic solution and a temperature of the aqueous electrolytic solution;
- apply a voltage to the plasma electrolyte polishing cell, thereby causing a plasma layer to form around a surface of the diesel engine component; and
- terminate the voltage to the plasma electrolyte polishing cell; and
- a coating system configured to apply a coating process to the diesel engine component.

17. The system of claim 16, wherein the diesel engine component is at least one of a high-pressure fuel injector component, a valve seat; and an injector nozzle.

18. The system of claim 17, wherein the diesel engine component is the injector nozzle, and wherein the controller is configured to applying the voltage to the plasma electrolyte polishing cell to cause the injector nozzle to be cleaned.

19. The system of claim 16, wherein the controller is configured to apply the voltage for a pre-determined period of time, and wherein the plasma layer is formed around the surface of the diesel engine component based on the pre-determined period of time.

20. The system of claim 16, wherein the controller is configured to:
- receive a user input indicating a period of time to apply the voltage, and
- wherein the controller is configured to apply the voltage to the plasma electrolyte polishing cell based on the period of time indicated by the user input.

21. The system of claim 16, wherein the coating system is a physical vapor deposition (PVD) system, wherein the PVD system applies the coating process to the diesel engine component to cause the surface of the diesel engine component to achieve a PVD coating finish.

22. The system of claim 16, wherein the coating system is a plasma enhanced chemical vapor deposition (PECVD) system, wherein the PECVD system applies the coating process to the diesel engine component to cause the surface of the diesel engine component to achieve a PECVD coating finish.

* * * * *